United States Patent
Inoue et al.

(10) Patent No.: US 8,828,254 B2
(45) Date of Patent: Sep. 9, 2014

(54) PLASMA PROCESSING METHOD

(75) Inventors: Yoshiharu Inoue, Kudamatsu (JP);
Tetsuo Ono, Kudamatsu (JP);
Michikazu Morimoto, Kudamatsu (JP);
Masaki Fujii, Shunan (JP); Masakazu Miyaji, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 98 days.

(21) Appl. No.: 13/363,415

(22) Filed: Feb. 1, 2012

(65) Prior Publication Data
US 2013/0029492 A1    Jan. 31, 2013

(30) Foreign Application Priority Data

Jul. 27, 2011  (JP) ................ 2011-163831
Sep. 28, 2011  (JP) ................ 2011-211896
Oct. 24, 2011  (JP) ................ 2011-232446

(51) Int. Cl.
*C03C 15/00* (2006.01)
*H01L 21/3213* (2006.01)
*H01J 37/32* (2006.01)

(52) U.S. Cl.
CPC ..... *H01L 21/32137* (2013.01); *H01J 37/32266* (2013.01); *H01J 37/32192* (2013.01); *H01J 37/3266* (2013.01)
USPC ............... 216/58; 216/37; 216/67; 438/690; 438/691; 438/692; 438/694; 156/345.28

(58) Field of Classification Search
USPC .............. 216/37, 58, 67; 438/690–694; 156/345.28
See application file for complete search history.

(56) References Cited

U.S. PATENT DOCUMENTS

| | | | |
|---|---|---|---|
| 5,318,665 A * | 6/1994 | Oikawa .................. | 438/720 |
| 6,255,221 B1 | 7/2001 | Hudson et al. | |
| 6,777,037 B2 * | 8/2004 | Sumiya et al. ........ | 427/569 |
| 7,214,628 B2 | 5/2007 | Chua | |
| 2012/0302065 A1 * | 11/2012 | Lin et al. .............. | 438/694 |

FOREIGN PATENT DOCUMENTS

| | | |
|---|---|---|
| JP | 6-267900 | 9/1994 |
| JP | 8-181125 | 7/1996 |
| JP | 9-92645 | 4/1997 |
| JP | 9-185999 | 7/1997 |
| JP | 2001-313284 | 11/2001 |
| JP | 2002-532899 | 10/2002 |
| KR | 10-2007-0089883 | 9/2007 |

* cited by examiner

*Primary Examiner* — Nadine Norton
*Assistant Examiner* — Maki Angadi
(74) *Attorney, Agent, or Firm* — Antonelli, Terry, Stout & Kraus, LLP.

(57) ABSTRACT

A plasma processing method and a plasma processing apparatus in which a stable process region can be ensured in a wide range, from low microwave power to high microwave power. The plasma processing method includes making production of plasma easy in a region in which production of plasma by continuous discharge is difficult, and plasma-processing an object to be processed, with the generated plasma, wherein the plasma is produced by pulsed discharge in which ON and OFF are repeated, radio-frequency power for producing the pulsed discharge, during an ON period, is a power to facilitate production of plasma by continuous discharge, and a duty ratio of the pulsed discharge is controlled so that an average power of the radio-frequency power per cycle is power in the region in which production of plasma by continuous discharge is difficult.

5 Claims, 11 Drawing Sheets

PLASMA PROCESSING METHOD

The present application is based on and claims priorities of Japanese patent application No. 2011-163831 filed on Jul. 27, 2011, Japanese patent application No. 2011-211896 filed on Sep. 28, 2011 and Japanese patent application No. 2011-232446 filed on Oct. 24, 2011, the entire contents of which are hereby incorporated by reference.

BACKGROUND OF THE INVENTION

1. Field of the Invention

The present invention relates to a plasma processing method and a plasma processing apparatus, and particularly to a plasma processing method and a plasma processing apparatus related to plasma etching.

2. Description of the Related Art

One of plasma etching apparatuses currently used for the mass production of semiconductor devices is an electron cyclotron resonance (hereinafter referred to as ECR) type apparatus. In this plasma etching apparatus, by applying a magnetic field to a plasma, and setting magnetic field strength so that the frequency of a microwave resonates with the cyclotron frequency of electrons, a high density plasma can be generated.

With the miniaturization of semiconductor devices in recent years, the thickness of the gate oxide film has been 2 nm or less. Therefore, it has been necessary to achieve the controllability of plasma etching processing, and a high selection ratio of the gate oxide film to the silicon film.

One of techniques for achieving the high precision plasma etching is a plasma etching method using pulsed discharge. For example, Japanese Patent Laid-Open Publication No. 09-185999 (Patent Document 1) discloses a method for attaining high precision etching by pulse-modulating a plasma, while measuring radical density in the plasma, to control the radical density.

In addition, Japanese Patent Laid-Open Publication No. 09-092645 (Patent Document 2) discloses a method for pulse-modulating a plasma and simultaneously synchronizing the phase of a radio-frequency bias applied to a wafer with the ON-OFF of the plasma to control the temperature of electrons in the plasma to prevent the dielectric breakdown of an oxide film on the wafer being processed.

In addition, Japanese Patent Laid-Open Publication No. 08-181125 (Patent Document 3) discloses a method for preventing the dielectric breakdown of an oxide film and simultaneously attaining high rate anisotropic etching by pulse-modulating a plasma at 10 to 100 μs and applying a radio-frequency bias at 600 KHz or less to a wafer.

In addition, Japanese Patent Laid-Open Publication No. 06-267900 (Patent Document 4) discloses a method for pulse-modulating a microwave for generating a plasma, to control radicals, and suppressing the instability of the plasma to decrease ion temperature.

Generally, an ECR type plasma etching apparatus has three problems as shown below.

The first problem is that there is a case where a lower density region (lower microwave power) is required according to processing, such as for an improvement in perpendicularity, but when the microwave power is decreased in order to decrease the plasma density, the production of a plasma is difficult.

The second problem is that when a discharge test is performed changing the power of the microwave, there is an unstable region in which the light emission of the plasma is seen as flickering in visual inspection or measurement by a photodiode or the like, depending on the microwave power. There is no reproducibility of characteristics, such as an etching rate, in this region, and therefore, etching conditions are set avoiding the unstable region, that is, a narrow process window is set in process development.

The discharge flicker of interest in the present invention is a phenomenon in which the electric field strength distribution within the chamber changes, depending on the microwave power, abnormal discharge is generated, for example, near the sample stage or near the microwave transmission window, in connection with the chamber shape, and blinking can be observed by visual inspection.

The third problem is that there is a high selection ratio region on the high microwave power side (high density region), but on the high microwave power side, a cut-off phenomenon occurs with an increase in plasma density, and a mode jump in which the distribution of plasma density in the chamber changes occurs. When this phenomenon occurs, the light emission intensity of the plasma and the peak value of the bias voltage (Vpp voltage) change suddenly, and with this, the distribution of the etching rate in the wafer surface also changes largely, and therefore, power around the mode jump can not be used.

These three problems are also common to an ECR type plasma etching apparatus using pulsed discharge. But, in the above-described conventional techniques, these three problems are not considered.

Therefore, the present invention provides a plasma processing method and a plasma processing apparatus in which a stable process region can be ensured in a wide range, from low microwave power to high microwave power.

SUMMARY OF THE INVENTION

The present invention is a plasma processing method for facilitating production of a plasma in a region in which production of a plasma by continuous discharge is difficult, and plasma-processing an object to be processed with such generated plasma, the method including: using pulsed discharge in which ON and OFF are repeated to facilitate production of the plasma, wherein radio-frequency power for producing the pulsed discharge, during an ON period, is such a power as to facilitate the production of a plasma by the continuous discharge, and a duty ratio of the pulsed discharge is controlled so that an average power of the radio-frequency power per cycle matches power in the region in which the production of a plasma by the continuous discharge is difficult.

In addition, the present invention is a plasma processing apparatus including a processing chamber in which a plasma is produced, plasma production means for producing the plasma, and a sample stage, on which a wafer is placed, provided within the processing chamber, and etching the wafer with the plasma, wherein the plasma production means includes a power supply for supplying power for producing the plasma, and a time-average value of the power is controlled by ON-OFF-modulating the power of the power supply, setting peak power during ON to a value at which when a plasma is generated by continuous discharge, instability of the plasma does not occur, and changing a duty ratio of the ON-OFF modulation.

In addition, the present invention is a plasma processing apparatus including a chamber which can be evacuated to introduce a reactive gas, a plasma production power supply for producing a discharge plasma within the chamber, and a sample stage, on which a wafer is mounted, within the chamber, further including means for pulse-modulating an output power of the plasma production power supply, setting peak power during ON to a power value sufficiently higher than a mode jump region in continuous discharge, and changing a duty ratio of the pulse modulation to control a time-average value of the power.

According to the present invention, a stable process region can be ensured in a wide range, from low microwave power to high microwave power.

DETAILED DESCRIPTION OF THE PREFERRED EMBODIMENTS

Figure 1:
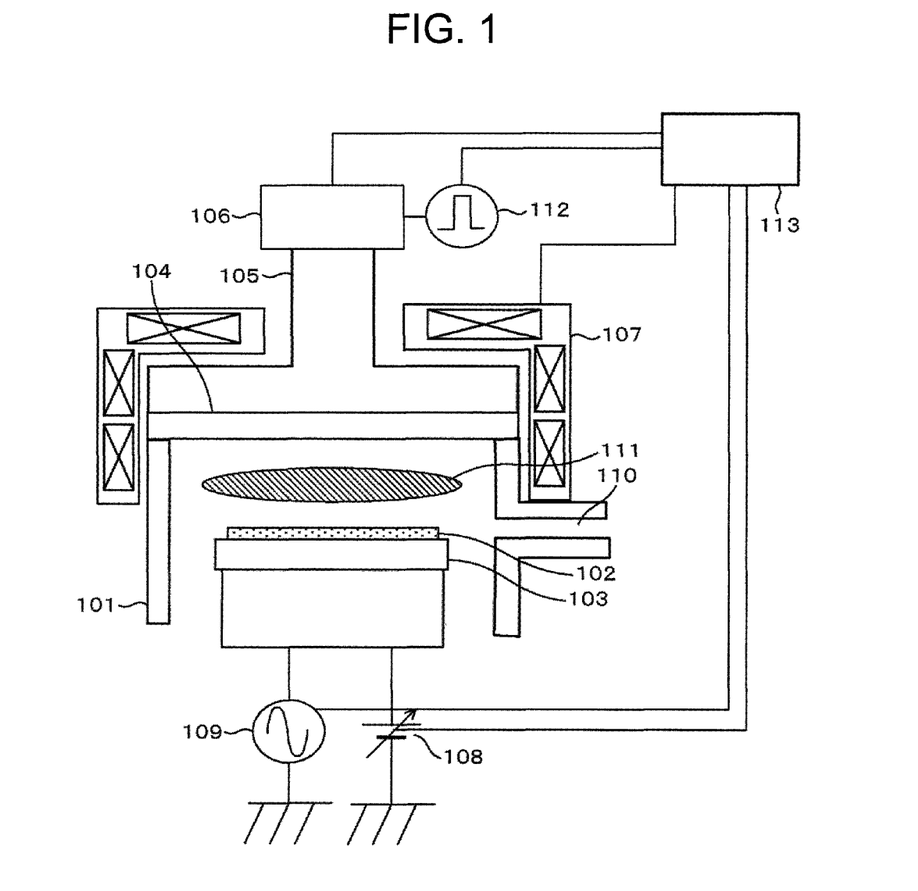
FIG. 1 is a schematic cross-sectional view showing one example of a plasma etching apparatus for carrying out the etching method of the present invention.

First, one example of a plasma etching apparatus for carrying out the present invention will be described with reference to the drawings. FIG. 1 is a schematic cross-sectional view of a microwave ECR plasma etching apparatus using a microwave and a magnetic field for plasma production means.

The microwave ECR plasma etching apparatus includes a chamber 101 which can be evacuated, a sample stage 103 on which a wafer 102, an object to be processed, is disposed, a microwave transmission window 104, such as quartz, provided on the upper surface of the chamber 101, a waveguide 105 and a magnetron 106 provided above the microwave transmission window 104, a solenoid coil 107 provided around the chamber 101, and an electrostatic adsorption power supply 108 and a radio-frequency power supply 109 connected to the sample stage 103.

The wafer 102 is carried into the chamber 101 from a wafer carry-in port 110, and then electrostatically adsorbed on the sample stage 103 by the electrostatic adsorption power supply 108. Next, a process gas is introduced into the chamber 101. The chamber 101 is evacuated to reduce pressure by a vacuum pump (not shown), and adjusted to a predetermined pressure (for example, 0.1 Pa to 50 Pa). Next, a microwave having a frequency of 2.45 GHz is oscillated from the magnetron 106, and propagated into the chamber 101 through the waveguide 105. The process gas is excited by the action of the microwave and a magnetic field generated by the solenoid coil 107, and a plasma 111 is formed in a space above the wafer 102. On the other hand, a bias is applied to the sample stage 103 by the radio-frequency power supply 109, and ions in the plasma 111 are perpendicularly accelerated onto the wafer 102 and enter the wafer 102. In addition, the radio-frequency power supply 109 can apply continuous radio-frequency power or time-modulated intermittent radio-frequency power to the sample stage 103.

Figure 2:
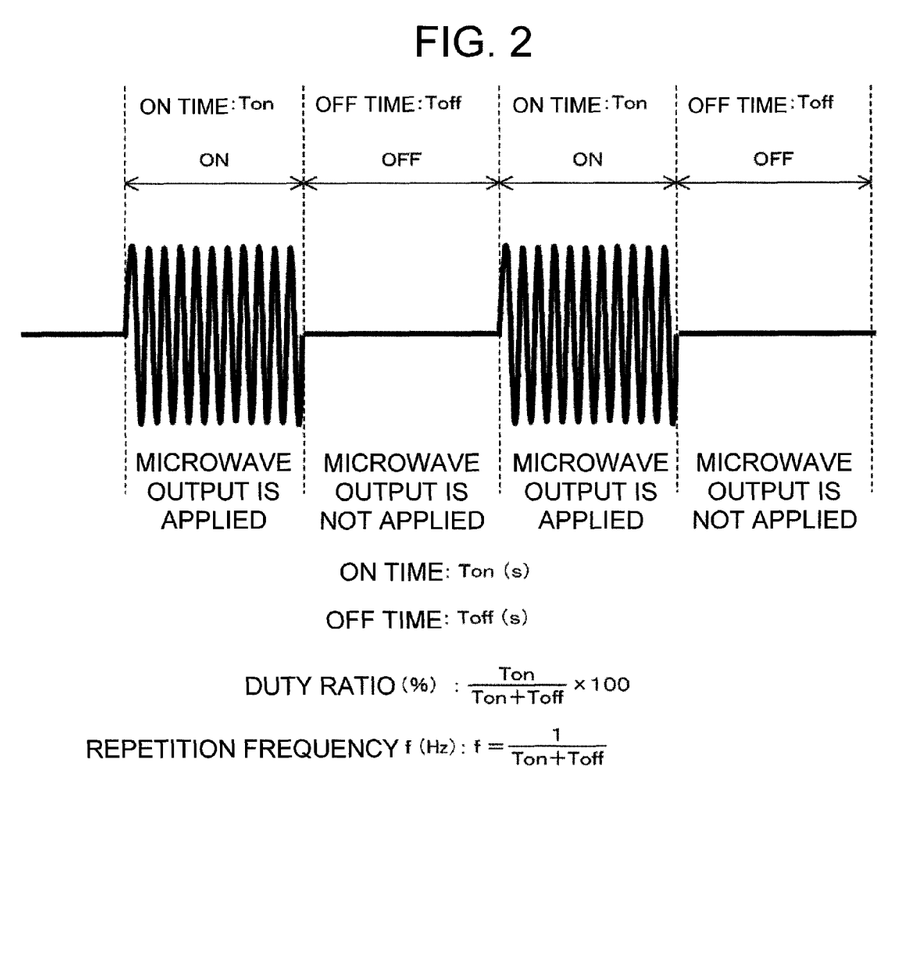
FIG. 2 shows the output waveform of the magnetron 106 of the apparatus shown in FIG. 1.

The wafer 102 is anisotropically etched by the action of radicals and ions from the plasma 111. In addition, a pulse generator 112 is attached to the magnetron 106, and thus, the microwave can be pulse-modulated in a pulse form at a repetition frequency which can be optionally set, as shown in FIG. 2.

In addition, when the microwave ECR plasma etching apparatus plasma-processes the wafer 102, a control part 113 controls each of the magnetron 106, the pulse generator 112, the solenoid coil 107, the radio-frequency power supply 109, and the electrostatic adsorption power supply 108 described above.

The microwave ECR plasma etching apparatus according to the present invention, used in Exemplary Embodiments described below, is a microwave ECR plasma etching apparatus which processes a wafer having a diameter of 300 mm. The inner diameter of the chamber 101 is 44.2 cm, and the distance between the wafer 102 and the microwave transmission window 104 is 24.3 cm (the volume of the space in which the plasma is generated: 37267 cm$^3$).

Next, the present invention for solving the first problem will be described by Exemplary Embodiment 1 and Exemplary Embodiment 2. The first problem is that when the microwave power is decreased in order to decrease the plasma density, the production of a plasma is difficult.

Exemplary Embodiment 1

The ignition characteristics of a plasma, depending on the duty ratio, and the time-average output of the microwave, were examined under conditions shown in Table 1, using the microwave ECR plasma etching apparatus shown in FIG. 1. Vpp in Table 1 is the voltage difference between a peak value and a peak value of a radio-frequency voltage applied to the sample stage 103.

In addition, the results of examining plasma production are shown in Table 2. "Good" in Table 2 indicates that a plasma was stably produced, and "Poor" indicates that a plasma could not be stably produced.

TABLE 1

| | |
|---|---|
| HBr gas | 200 ml/min |
| O$_2$ gas | 3 ml/min |
| Ar gas | 200 ml/min |
| Ar + CH$_4$(4%) gas | 30 ml/min |
| Process pressure | 0.8 Pa |
| RF bias | Vpp 350 V constant (about 40 W) |
| Microwave ON-OFF repetition frequency | 5 kHz |

TABLE 2

| Duty ratio | Microwave time-average output (W/cm³) | | | | |
| --- | --- | --- | --- | --- | --- |
| | 0.0027 (about 100 W) | 0.0054 (about 200 W) | 0.007 (about 260 W) | 0.0086 (about 320 W) | 0.011 (about 400 W) |
| 20% | Good | Good | Good | Good | Good |
| 50% | Poor | Good | Good | Good | Good |
| 65% | Poor | Poor | Good | Good | Good |
| 80% | Poor | Poor | Poor | Good | Good |
| 100% (Continuous discharge) | Poor | Poor | Poor | Poor | Good |

From Table 2, in the case of continuous discharge, a plasma is stably produced when a value obtained by dividing the time-average output of the microwave by the volume of the inner wall of the chamber 101 is 0.011 W/cm³ (about 400 W) or more, and a plasma is not produced when the value is less than 0.011 W/cm³. The reason why a plasma is not produced is that the energy required for free electrons to ionize the molecules of the etching gas is not supplied. But, in the cases of discharge with a pulsed microwave, a plasma is produced even if a value obtained by dividing the time-average output of the microwave by a volume in which the plasma is produced is smaller than 0.011 W/cm³.

This difference in plasma production between by the continuous discharge and by the pulsed microwave discharge is due to the following reason.

During several μsec during a period during which the microwave is ON, free electrons ionize or dissociate other atoms and molecules with energy obtained from the microwave, to produce the plasma 111. Then, during a period during which the microwave is OFF, most of the free electrons are captured by the atoms and the molecules during several μsec, and a large portion of the plasma 111 forms anions and cations. Since the anions and the cations have a larger mass than the electrons, the anions and the cations collide with each other and are neutralized, and a time of several tens of ms is required until the plasma 111 dissipates. Therefore, when the OFF time of the microwave is shorter than 10 ms, the ON period of the microwave starts before the plasma 111 dissipates, and the plasma 111 is maintained.

Therefore, when the results shown in Table 2 are put another way, it can be said that when the output during the ON period of the pulsed microwave is equal to or more than the minimum output required to stably produce a plasma by continuous discharge (that is, 0.011 W/cm³ or more), a plasma can be stably produced even if the time-average output of the pulsed microwave is 0.011 W/cm³ or less. Further, it can be said that when the OFF period of the pulsed microwave is 10 ms or less, a plasma can be more stably produced than the above-described plasma processing method, even in a region in which the time-average output of the pulsed microwave is 0.011 W/cm³ or less.

Further, a plasma is easily stably produced by adding an inert gas, such as an argon gas (Ar, ionization energy: 1520.6 kJ/mol) or a nitrogen gas (N₂, ionization energy: 1402 kJ/mol), or adding an easily ionizable gas other than the above inert gas. The type of other gases, the flow rate of each gas, the process pressure, the RF bias value, and the like do not specially limit the effect of this Exemplary Embodiment.

Figure 3:
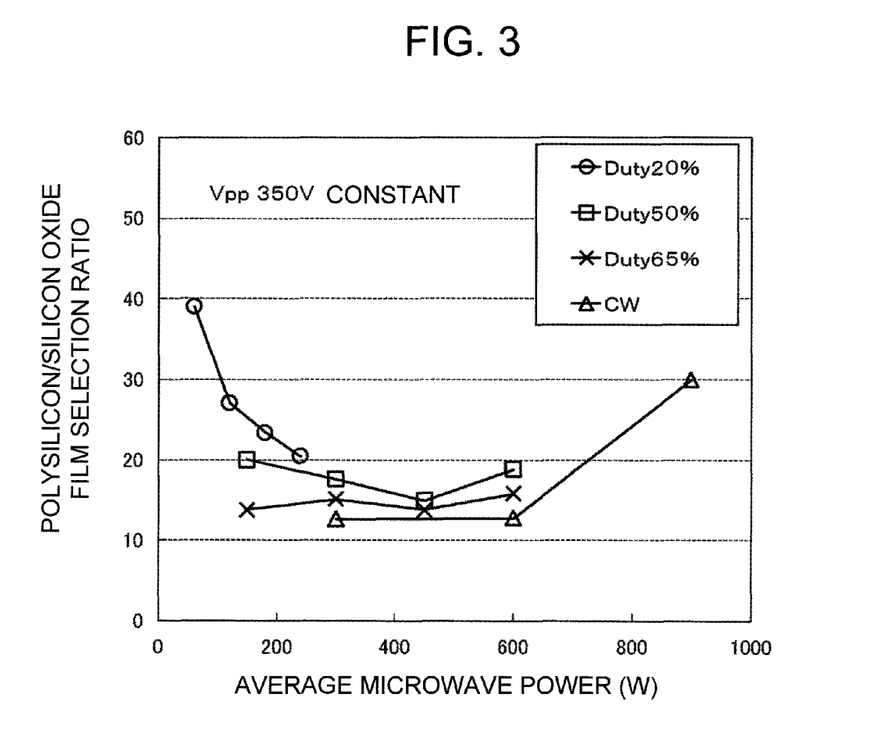
FIG. 3 is a graph showing the effect of improving a selection ratio according to the present invention.

Next, a wafer having a polysilicon film on the entire surface thereof and a wafer having a silicon oxide film on the entire surface thereof were etched under the conditions in Table 1, and a selection ratio was obtained from the ratio of their respective amounts of etching. The results are shown in FIG. 3. "%" in FIG. 3 means a duty ratio when pulsed discharge was performed.

From FIG. 3, it is seen that when the duty ratio is 50% or less, and the microwave time-average output is 400 W (0.011 W/cm³) or less, the selection ratio increases more than in continuous discharge. The reason for this is considered to be that when the time-average output of the microwave is small, the number of free electrons within the chamber 101 decreases, and electrons corresponding to this decrease excite atoms and molecules, and therefore, the density of the radical species increases, and the selection ratio is improved.

In addition, the selection ratio is further increased by controlling the oxygen gas in the conditions in Table 1 at 1 ml/min or more and 10 ml/min or less.

In addition, while this Exemplary Embodiment is an example in which the plasma processing method of the present invention is applied to the microwave ECR plasma etching apparatus, the plasma processing method of the present invention can be similarly applied to a capacitively coupled or inductively coupled plasma etching apparatus. As described above, the plasma processing method of the present invention is a method for processing an object to be processed by pulsed discharge in which the radio-frequency power during the ON period of the pulsed discharge is radio-frequency power in which a plasma by continuous discharge can be stably produced, and the OFF period of the pulsed discharge is 10 ms or less. By such a plasma processing method of the present invention, a plasma can be stably produced even in a region in which the plasma production power is small, in which it is difficult to stably produce a plasma.

Further, in the plasma processing method of the present invention, when the duty ratio of the pulsed discharge is 50%, or less, the selection ratio of the etching rate of the polysilicon film to the silicon oxide film can be more improved than in continuous discharge.

Exemplary Embodiment 2

Next, another Exemplary Embodiment of the present invention described in Exemplary Embodiment 1 will be described.

When plasma processing by pulsed discharge is performed under conditions shown in Table 3, the performance of the removal of the carbon-based deposits and the removal of the resist is more improved than in continuous discharge.

TABLE 3

| | |
| --- | --- |
| Oxygen (O₂) gas | 200 ml/min |
| Process pressure | 1.0 Pa |
| RF bias | 0 W |
| Microwave ON-OFF repetition frequency | 5 kHz |

The ratio of the light emission intensity of oxygen to the light emission intensity of argon was measured, adding an argon gas at 5 ml/min under the conditions shown in Table 3. The results are shown in FIG. 4.

Figure 4:
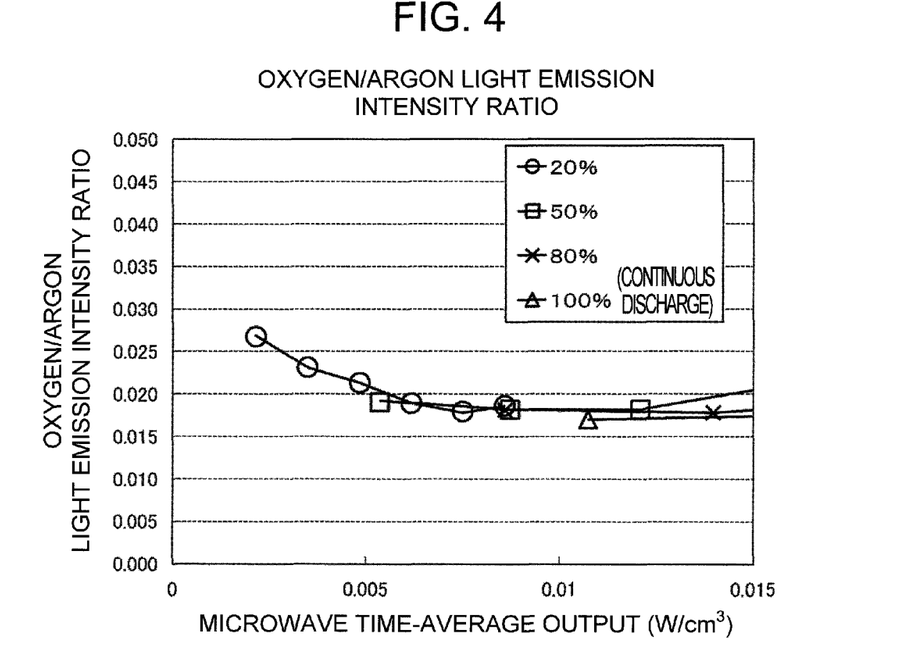
FIG. 4 is a graph showing the dependence of the light emission intensity of oxygen atoms on the time-average output of a microwave according to the present invention.

From FIG. 4, it is seen that the light emission intensity of oxygen atoms is strong at less than 0.011 W/cm³, a value obtained by dividing the time-average output of the microwave by a volume in which the plasma is generated.

In other words, when the pulsed discharge of the present invention is performed under the conditions shown in Table 3, the oxygen radical density increases, and the effect of the removal of the carbon-based deposits and the removal of the resist is improved.

Next, the present invention for solving the second problem will be described by Exemplary Embodiment 3 to Exemplary Embodiment 5. The second problem is that when a discharge test is performed changing the power of the microwave, there is an unstable region in which the light emission of the plasma is seen as flickering in visual inspection or measurement by a photodiode or the like, depending on the microwave power.

Exemplary Embodiment 3

The plasma etching in this Exemplary Embodiment used the microwave ECR plasma etching apparatus shown in FIG. 1. Next, an example of conditions for etching a polysilicon film 302 is shown in Table 4. Under the conditions, the polysilicon film 302 can be etched at a high selection ratio to a base oxide film 303.

TABLE 4

| | |
|---|---|
| HBr gas | 140 ml/min |
| $O_2$ gas | 2 ml/min |
| Process pressure | 1.6 Pa |
| RF bias (output per wafer area) | 50 W (0.071 W/cm$^2$) |

Changing the microwave for generating a plasma, under the conditions shown in Table 4, light emission from the plasma 111 was detected by a photodiode, and its flicker was measured. The results are shown in Table 5. For the power of the microwave, a case where continuous discharge was performed is compared with a case where the power was controlled by setting the power during the ON period of the microwave to 1500 W, performing ON-OFF modulation at a repetition frequency of 1 KHz, and changing the duty ratio. In Table 5, "Good" indicates that there was no discharge flicker, and "Poor" indicates that there was discharge flicker. Etching cannot be performed in a state in which discharge flickers.

TABLE 5

| | Time-average microwave power (W) | | | | | | | | | | | |
|---|---|---|---|---|---|---|---|---|---|---|---|---|
| | 400 | 500 | 600 | 700 | 800 | 900 | 1000 | 1100 | 1200 | 1300 | 1400 | 1500 |
| Continuous discharge | Good | Good | Good | Good | Good | Poor | Poor | Poor | Good | Good | Good | Good |
| Pulsed discharge (peak Power: 1500 W) | Good | Good | Good | Good | Good | Good | Good | Good | Good | Good | Good | Good |

In the continuous discharge, flicker occurs at 900 W to 1100 W, but the flicker of the discharge can be eliminated by the ON-OFF control of the microwave. The reason is presumed to be that the plasma 111 generated by instantaneous power is set to be in a stable region, and further, when pulsed discharge is performed with the plasma 111 of a gas that easily forms negative ions, such as a halogen gas, electrons disappear in several tens of μs during OFF, and for several ms after this, negative ions and positive ions are involved in maintaining the discharge, and therefore, the state of the sheath of the plasma 111 produced at the interface between the chamber wall and the plasma 111 is different from that in continuous discharge, and the flicker is eliminated.

The time until the plasma 111 dissipates is several tens of ms, and therefore, when the OFF time is 10 ms or less, ON starts before the plasma 111 dissipates, and the plasma is maintained.

The power region in which the plasma 111 flickers depends on the conditions. Therefore, in etching under other conditions, flicker can be eliminated when, first, the microwave power is changed in continuous discharge to check a region in which the discharge flickers, as in Table 5, to set the power during the ON period of the microwave sufficiently larger than power in which flicker occurs, and the microwave is ON-OFF pulse-modulated at a frequency at which the OFF time is 10 ms or less.

When the size of the chamber 101 changes, the power of the microwave shown in Table 5 changes according to its volume. 1500 W corresponds to about 0.04 W/cm$^3$ when converted to microwave power per unit volume.

The fact that there is an unstable region in discharge is not limited to microwave plasma etching apparatuses. Inductively coupled or capacitively coupled plasma etching apparatuses also have a similar problem. Also in these apparatuses, discharge instability can be avoided by the present invention.

Exemplary Embodiment 4

Figure 5:
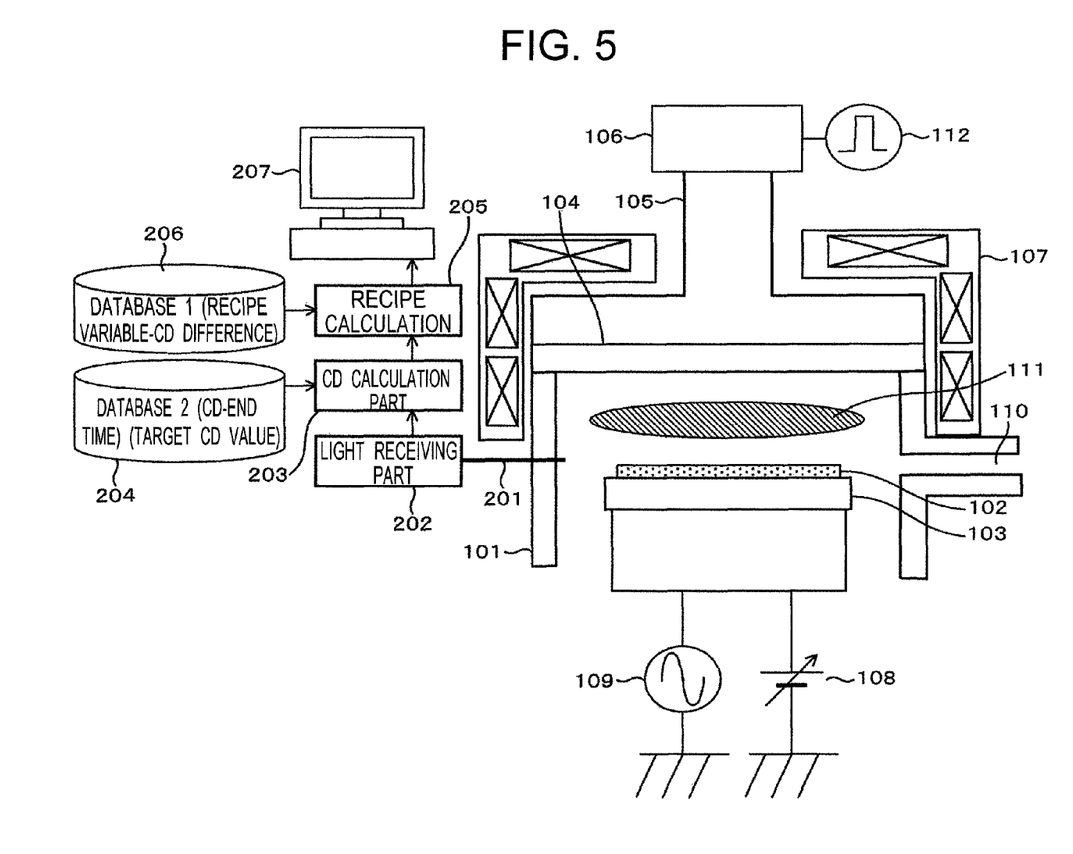
FIG. 5 is a schematic cross-sectional view of a plasma etching apparatus which performs feedback control in which the duty ratio of pulsed discharge is changed for each wafer according to the Exemplary Embodiment 4 of the present invention.

Next, an Exemplary Embodiment concerning a method for controlling an etching processing dimension (hereinafter referred to as "CD") enabled by the ON-OFF modulation of the plasma 111 will be described. FIG. 5 shows a schematic view of a plasma etching apparatus in which a mechanism for measuring an etching end time obtained from the light emission intensity of the plasma 111 or a change in light emission intensity, or the like, and, based on this monitored value, changing the etching conditions of the wafer 102 being processed or the wafer 102 to be processed next is added to the microwave ECR plasma etching apparatus shown in FIG. 1.

Figure 6:
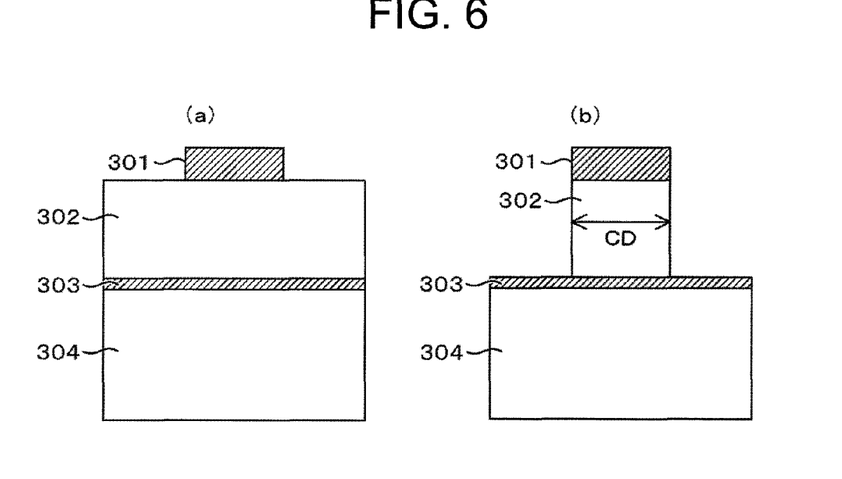
FIG. 6 is a cross-sectional view of a fine pattern on a wafer to be processed.

A light receiving part 202, a CD calculation part 203, a recipe calculation part 205, a first database 206, a second database 204, and an etching control PC 207 shown in FIG. 5 are communicatively coupled via communication means. FIG. 6 is a cross-sectional view of a fine pattern on the wafer 102 to be processed and shows a state in which a polysilicon film 302 lying on a silicon substrate 304 and a base oxide film 303 is etched in the form of the same pattern as a mask 301, such as silicon nitride, processed in the form of a fine pattern.

In dry etching, usually, processing as shown in FIG. 6 is continuously performed for 1 lot (25 wafers). The processed line width (hereinafter referred to as "CD") needs to be within a certain tolerance during the continuous processing. But, there is a case where reaction products of etching, and the like adhere to the inside of the chamber 101, and so on, and thus, the plasma state changes with time, and the fluctuations in CD are not within a tolerance.

In this Exemplary Embodiment, the fluctuations in CD are controlled within a tolerance by ON-OFF-modulating the plasma 111 and changing the duty ratio for each wafer. Usually, the CD changes, depending on the bias power applied to the wafer 102, and the plasma density, that is, the microwave power, and therefore, the CD can be changed by changing the microwave power.

Next, a specific method will be described. The end point of the etching of the polysilicon film 302 shown in FIG. 6 is detected by the light emission of a reaction product in the plasma 111, for example, light of silicon having 426 nm, by an optical fibre 201 and the light receiving part 202. There is a correlation between the end time of etching and CD, and the relationship between the etching end time and CD is stored in the second database 204. The CD calculation part 203 calculates an estimate of the CD of this wafer 102 from the etching end time. The difference between the calculated CD and a CD target value is calculated, and the value of this difference is sent to the recipe calculation part 205.

Figure 7:
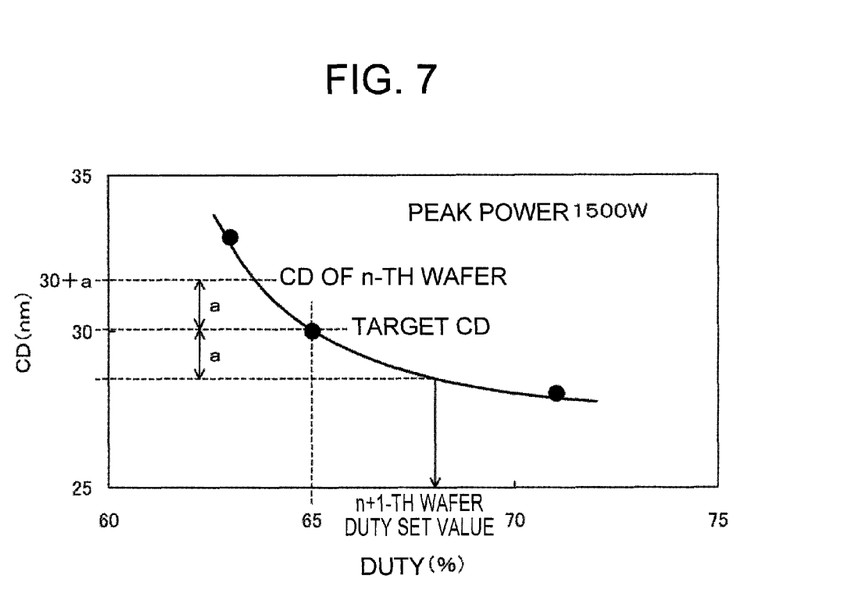
FIG. 7 is a diagram showing the data of the correlation between microwave power (duty ratio) and CD in the Exemplary Embodiment 4 of the present invention.

The recipe calculation part 205 has the first database 206 in which the data of the correlation between microwave power (duty ratio) and CD shown in FIG. 7 is stored, and calculates the variable of microwave power required to make the difference from the target value of CD zero. For example, as shown in FIG. 7, when the target CD is 30 nm, and the CD of the n-th wafer is 30+a (nm), the average microwave power, that is, the duty ratio, for the n+1-th wafer is increased by d (%) in order to achieve the target CD, that is, in order to narrow CD by a (nm).

The duty ratio calculated from the first database 206 is sent to the etching control PC 207. When the next wafer 102 is processed, etching is performed setting this value. At this time, when the plasma 111 is continuously discharged, the microwave power value corrected so that the CD difference is zero may be in the unstable region of the plasma 111 shown in Table 5, which hinders etching. As described in Exemplary Embodiment 3, when the microwave power is controlled by ON-OFF-modulating the plasma 111 and changing the duty ratio, the problem of the instability of the plasma 111 can be eliminated.

Exemplary Embodiment 5

Figure 8:
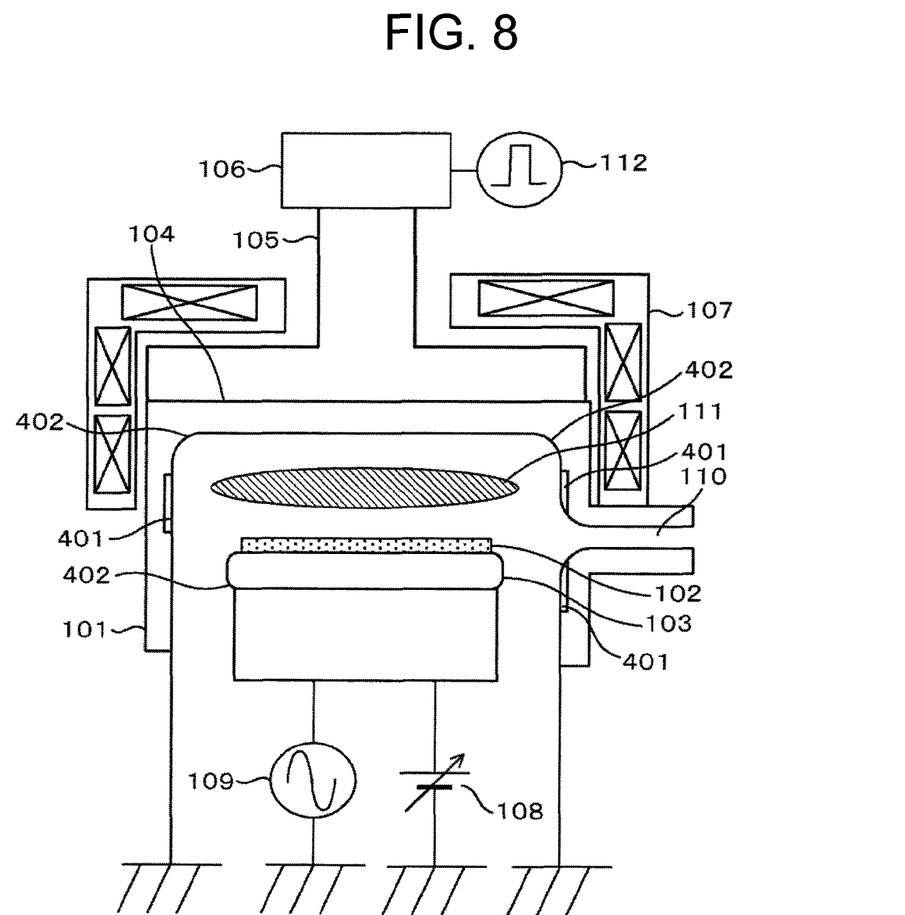
FIG. 8 is a schematic cross-sectional view showing a plasma etching apparatus in the Exemplary Embodiment 5 of the present invention.

Next, a method that increases the margin of stability more when used in combination with the present invention in order to prevent discharge instability will be described by FIG. 8. First, in order to stabilize the potential of the plasma 111, it is desired to provide an earth surface 401 through which a direct current flows, in a portion to be in contact with the plasma 111.

Usually, the inner wall of the chamber 101 is subjected to stabilization with alumite, yttrium oxide, or the like. These materials are insulators, and therefore, a direct current does not flow through them. By peeling these insulating films, inserting a conductor, or the like, in part of the portion to be in contact with the plasma 111, and further setting the conductor portion at an earth potential, the potential of the plasma 111 is stabilized, and therefore, the discharge is more stabilized. It is desired that the area of the direct current earth surface 401 is 10 cm$^2$ or more.

Next, it is desired that the pressure of the process gas is set to 0.1 to 10 Pa. If the pressure is too low, the mean free path of electrons increases, and a chance that the electrons dissipate on the wall before ionization occurs increases, which causes the instability of the plasma 111. In addition, if the pressure is too high, the ignition characteristics worsen, and instability occurs easily.

Further, for the shape of the chamber 101 and the sample stage 103, it is desired to decrease portions in which the electric field is locally strong to a minimum. In other words, sharp unevenness should not be provided, and a corner portion 402 should have a curve having a radius of 5 mm or more.

Next, the present invention for solving the third problem will be described by Exemplary Embodiment 6 and Exemplary Embodiment 7. The third problem is that there is a high selection ratio region on the high microwave power side (high density region), but on the high microwave power side, a cut-off phenomenon occurs with an increase in plasma density, and a mode jump in which the distribution of plasma density in the chamber changes occurs.

Plasma etching in Exemplary Embodiment 6 and Exemplary Embodiment 7 was performed using the microwave ECR plasma etching apparatus shown in FIG. 1.

Exemplary Embodiment 6

Figure 9:
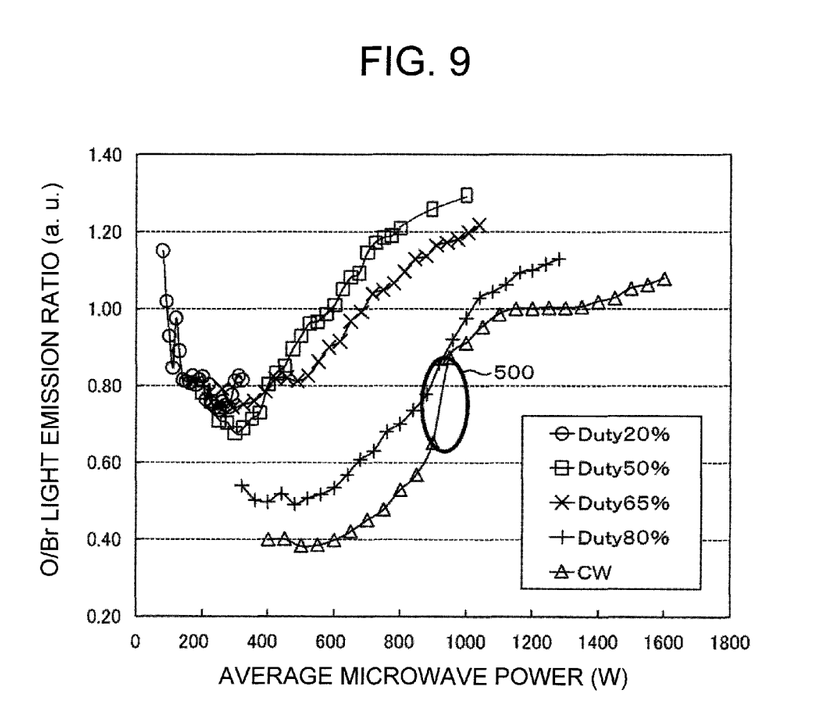
FIG. 9 is a graph showing an O (oxygen)/Br (bromine) light emission intensity ratio with respect to a microwave according to the present invention.

As shown in FIG. 3, the polysilicon-to-silicon oxide film selection ratio also increases in a region in which the average microwave power is large (800 W or more). In order to explain the reason for this, the relationship between microwave power and the light emission intensity ratio of O (oxygen) to Br (bromine) is shown in FIG. 9. As is seen from FIG. 9, the light emission intensity of O (oxygen), that is, the density of O radicals, increases on the high microwave side. Therefore, it is considered that the etching of the silicon oxide film is suppressed, and the selection ratio is improved.

However, when the microwave power value is further increased, a sudden change in light emission intensity, that is, the above mode jump phenomenon (during CW) 500, occurs at a microwave power value of 900 W or more in CW (continuous discharge), as shown in FIG. 9. Therefore, the high microwave region can not be used in continuous discharge.

Therefore, in the present invention, the microwave is pulsed, the peak power during ON is set sufficiently higher than the power value at which the mode jump occurs, and the duty ratio is controlled. It is seen that at a duty of 65%, or less, there is no sudden change in light emission intensity ratio (FIG. 9), that is, a mode jump is avoided.

The reason for this is presumed as follows. In the CW (continuous discharge), the electron density increases with the microwave power value, and the mode changes from a power value at which a density at which the oscillation of the plasma 111 resonates with the frequency of the electromagnetic wave is reached. On the other hand, with the pulsed microwave, during OFF, most of free electrons are captured by atoms and molecules during several μsec, and a large portion of the plasma 111 forms anions and cations. Therefore, with the pulsed microwave in which ON-OFF is repeated, an increase in electron density does not occur.

Figure 10:
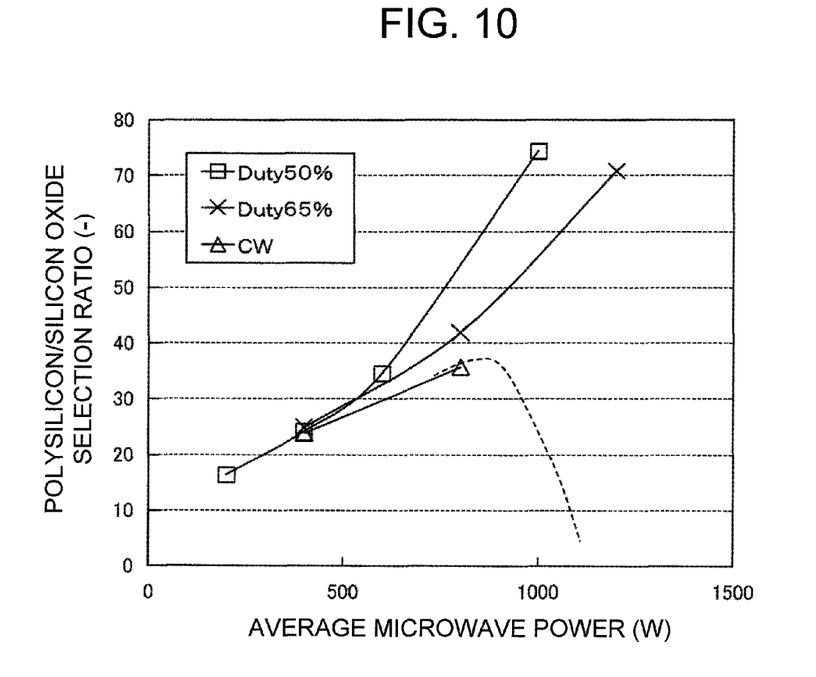
FIG. 10 is a graph showing a polysilicon/silicon oxide film selection ratio with respect to a pulsed microwave according to the present invention.

The results of the selection ratio evaluated on the high microwave power side, using the conditions in Table 1, are shown in FIG. 10. In the CW (continuous discharge), the selection ratio decreases (becomes unstable) at a microwave power value of 900 W or more due to the effect of the mode jump, whereas by pulsing the microwave, the high microwave power side can be used, and a high selection ratio can be obtained.

It is known that, generally, in pulsed discharge, the electron density decreases by one or more orders of magnitude in 50 μs after the power is turned OFF. Therefore, when discharge is pulsed, and the repetition frequency of the pulse and the duty ratio are set so that the OFF time of the pulsed discharge is 50 μs or more, a mode jump can be sufficiently avoided.

As described above, in the present invention, by pulse-modulating the microwave, a mode jump which occurs on the high microwave power side can be avoided, and the process region effective for etching can be expanded.

Exemplary Embodiment 7

Next, a method and an apparatus for automatically avoiding this mode jump region will be described. A mode jump occurs in a high power region of a microwave power of about 900 W or more, as shown in FIG. 9. The density of the plasma 111 is different depending on the pressure of the gas and the type of the gas, and therefore, the power in which a mode jump occurs is also different depending on these conditions.

In the method for avoiding this, first, a power value at which a mode jump occurs under the conditions used is previously measured, and the apparatus is adapted to include the function of storing etching conditions and power in which a mode jump occurs under the conditions, and automatically pulse-modulating microwave power when using the power in which a mode jump occurs under the conditions. In an apparatus having this function, the erroneous operation of erroneously using a mode jump region can be prevented.

Figure 11:
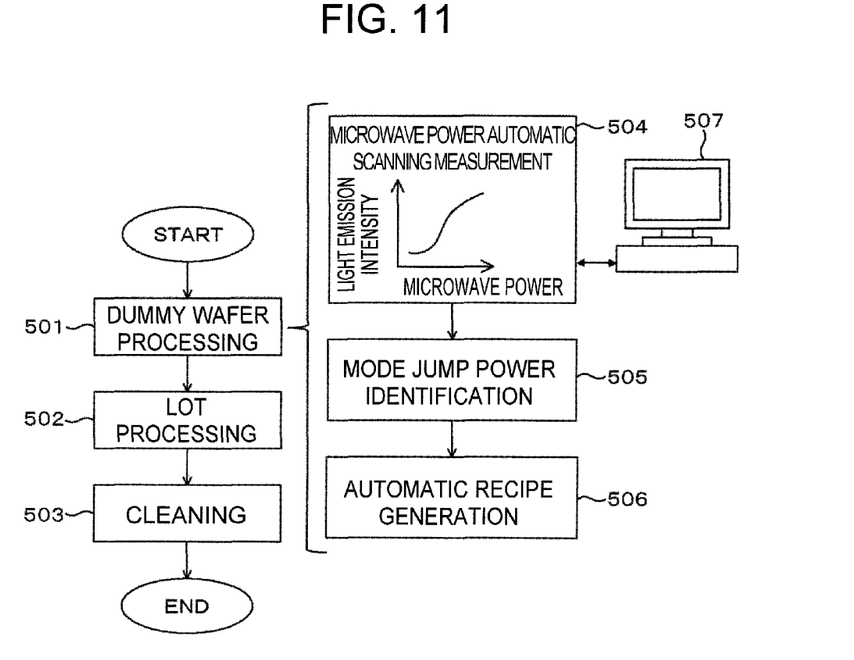
FIG. 11 is a process flow chart of an apparatus for automating the measurement of power in which a mode jump occurs.

Further, an apparatus for previously automating the measurement of power in which a mode jump occurs will be described. A process flow chart of an apparatus for automating the measurement of power in which a mode jump occurs is shown in FIG. 11. Usually, etching is performed in a lot (25 wafers) unit. Before a lot is processed, dummy wafer processing 501 is performed under the same conditions as the subsequent processing conditions.

Then, lot processing 502, and the cleaning 503 of the chamber 101 with the plasma 111 of oxygen, or the like follow. The dummy wafer processing 501 includes microwave power automatic scanning measurement 504 which is the step of automatically scanning microwave power set values, for example, 800 W to 1200 W, and measuring the light emission intensity of the plasma 111 during this period by a photodiode or the like.

Next, an etching apparatus-controlling personal computer 507 includes the function of performing mode jump power identification 505 in which from this data, a region in which the light emission intensity changes suddenly is extracted and stored, and further performing automatic recipe generation 506 in which pulse modulation is automatically performed when the microwave power corresponds to the mode jump region when a recipe is input. Due to this function, a worker can perform etching without being troubled by the mode jump region.

In addition, the physical amount that is measured when the microwave power is scanned is not limited to light emission intensity. An amount that changes suddenly according to a mode jump, such as the peak value of a bias voltage (Vpp), can serve the same function. In addition, the absolute value of the microwave power described in the present invention changes largely, mainly according to the size of the chamber 101, that is, the diameter of the wafer 102 to be processed. As a standard, when a value normalized by the volume of the chamber 101 is used, the microwave power can be converted to an amount that does not depend on the volume of the chamber 101. For example, 900 W corresponds to 0.024 W/cm$^3$ in the above Exemplary Embodiments.

What is claimed is:

1. A plasma processing method for facilitating generation of a plasma in a region in which a plasma is incapable of being generated stably by continuous discharge, and plasma-processing a substrate to be processed with the plasma generated in the region in which a plasma is incapable of being generated stably by continuous discharge, the method comprising:
   predetermining a first range of radio-frequency power and a second range of radio-frequency power, respectively; and
   generating plasma modulated by a pulse which repeats ON and OFF in the region in which a plasma is incapable of being generated stably by continuous discharge, wherein
   the substrate is a semiconductor;
   the first range of radio-frequency power is a range of a radio-frequency power with which a plasma is incapable of being generated stably by continuous discharge, and the second range of radio-frequency power is a range of radio-frequency power with which generation of plasma is facilitated by continuous discharge;
   a radio-frequency power during an ON period of the pulse is a value in the second range of radio-frequency power;
   a duty ratio of the pulse is a value obtained by dividing an average radio-frequency power of the pulse per cycle by the radio-frequency power during an ON period of the pulse; and
   the average radio-frequency power of the pulse per cycle is a value in the first range of radio-frequency power.

2. The plasma processing method according to claim 1, wherein an OFF period of the pulse is 10 ms or less.

3. The plasma processing method according to claim 1, wherein a value obtained by dividing the average radio-frequency power by a volume of a plasma processing chamber in which the substrate to be processed is plasma-processed is 0.011 W/cm$^3$ or less.

4. The plasma processing method according to claim 1, wherein
   the substrate to be processed has a polysilicon film and a silicon oxide film, and
   the pulse-modulated plasma is produced using a hydrogen bromide gas and an oxygen gas.

5. The plasma processing method according to claim 4, wherein
   a flow rate of the oxygen gas is 1 ml/min to 10 ml/min.

* * * * *